United States Patent
Krasnoperova

(10) Patent No.: US 7,571,418 B2
(45) Date of Patent: Aug. 4, 2009

(54) SIMULATION SITE PLACEMENT FOR LITHOGRAPHIC PROCESS MODELS

(75) Inventor: Azalia Krasnoperova, Mahwah, NJ (US)

(73) Assignee: International Business Machines Corporation, Armonk, NY (US)

(*) Notice: Subject to any disclaimer, the term of this patent is extended or adjusted under 35 U.S.C. 154(b) by 148 days.

(21) Appl. No.: 11/615,221

(22) Filed: Feb. 20, 2007

(65) Prior Publication Data

US 2008/0201684 A1 Aug. 21, 2008

(51) Int. Cl.
*G06F 17/50* (2006.01)
(52) U.S. Cl. .............................. 716/19; 716/11; 716/12
(58) Field of Classification Search ................ 716/11, 716/12, 19; 703/14
See application file for complete search history.

(56) References Cited

U.S. PATENT DOCUMENTS

| 6,453,457 | B1 | 9/2002 | Pierrat et al. |
|---|---|---|---|
| 6,625,801 | B1 | 9/2003 | Pierrat et al. |
| 6,872,494 | B2 | 3/2005 | Hoshino |
| 6,918,104 | B2 | 7/2005 | Pierrat et al. |
| 2004/0133871 | A1 | 7/2004 | Granik et al. |
| 2005/0138596 | A1 | 6/2005 | Medvedeva et al. |
| 2006/0271905 | A1* | 11/2006 | Mukherjee et al. ............ 716/21 |

* cited by examiner

*Primary Examiner*—Thuan Do
(74) *Attorney, Agent, or Firm*—Todd M. C. Li

(57) ABSTRACT

A method and system for performing the method are provided for designing a mask layout that includes selecting simulation sites for optical proximity correction (OPC) or mask verification, prior to fragmentation of shape edges. The primary simulation sites are selected based upon the influence of adjacent shapes, and then fragmentation is performed based on the primary simulation sites. Preferably, the simulation sites are selected by initial simulation within a region of influence of the vertices of mask shapes. The extrema of the resulting simulations are identified, and the intersection of a projection from the extrema to shape edges is used to define the primary simulation sites. Fragmentation of the edges may then be performed as long as the primary simulation sites thus selected are retained. The resulting simulation sites will allow the OPC engine to more effectively correct the shapes where the greatest influences will occur.

3 Claims, 13 Drawing Sheets

US 7,571,418 B2

SIMULATION SITE PLACEMENT FOR LITHOGRAPHIC PROCESS MODELS

FIELD OF THE INVENTION

The present invention relates to the manufacture of integrated circuits and a method for designing lithographic masks for use in the manufacture of integrated circuits. More particularly, the present invention relates to a method for selecting fragmentation and simulation sites for use in model-based optical proximity correction (MBOPC).

BACKGROUND OF THE INVENTION

Referring to FIG. 1, to represent an integrated circuit in a way consistent with the semiconductor manufacturing technology, circuit designers convert a circuit design into a series of physical layouts that consists of simple geometrical shapes by means of computer aided design (CAD) tools (Block 101). The physical layout represents shapes that are meant to be manufactured on the wafer, for example, by photolithography, wherein the physical layout is represented as shapes on a lithographic mask, and corresponding shapes are formed on a wafer by imaging the mask shapes onto the wafer by processes, for example, such as exposing a photoactive material (e.g. a photoresist), followed by patterned etching.

Due to resolution limitations, current state-of-the art manufacturing tools (such as lithography systems) are not able to reproduce shapes on the wafer that are taken directly from the CAD tools. Thus, simple CAD shapes are processed by another software tool—the Optical Proximity Correction (OPC) tool, which modifies the mask shapes to account for such resolution limitations (Block 105). An OPC tool, having a CAD physical layout as an input, pre-distorts or modifies the shapes in such a way that a lithography system, which use the OPC pre-modified shapes as an input (e.g. as formed on a lithographic mask or reticle), produce physical shapes on a silicon wafer that are as close as possible to the original CAD shapes. An OPC tool is part of data preparation (DP) for manufacturing of a reticle (Block 110). A reticle is a physical media on which the OPC modified design shapes are materialized in the form of dark and bright areas. The reticle is a part of a lithography system that is used to form the intended physical layout on a silicon wafer.

A model-based OPC (MBOPC) tool typically distorts layout shapes by breaking the edges of the original physical layout shapes into small pieces (fragments) (Block 102). Then, associated with each fragment, simulation sites are defined (Block 103). The MBOPC algorithm (Block 105) includes the following steps. The image produced by the layout shapes is simulated at the associated simulation sites by a model, which typically includes optical processes, and may also include semiconductor processes (Block 106). The MBOPC tool then compares the simulated images at the simulation sites to the target shapes that are to be produced on the wafer, for example, by determining the edge placement error (EPE) (Block 107). The OPC algorithm then moves the associated fragments into positions to correct for deviations of the image from the target design shapes, within pre-defined tolerance criteria (Block 109), and the simulation is repeated as necessary, until the EPE is sufficiently small or other acceptance criteria are met (Block 108). Number of points where the new edge position has to be calculated (hence number of fragments) affect the MBOPC processing time (aka runtime). To have a reasonable runtime for modern integrated circuits, number of fragments and simulation sites have to be minimized but not denigrate the quality of OPC distortions.

However, the placement of simulation sites and the method of breaking the physical layout into fragments in MBOPC are determined by certain rules, for example, as defined in a user recipe template or setup file, prior to applying the model and prior to movement of edges. Such rules are based on general heuristics, and may not adequately account for local characteristics of the layout.

For example, referring to FIG. 2A, a layout shape 200 is fragmented according to fragmentation points a-h, thus defining edge segments a-b, b-c, c-d, d-e, e-f, f-g, g-h and h-a. Simulations sites are assigned to edge segments, for example, site 201 corresponding to segment b-c, site 202 corresponding to segment d-e, site 203 corresponding to segment g-f, and site 204 corresponding to segment a-h. Simulation sites are not necessarily assigned to every edge segment. However, if the fragmentation is not fine enough, the match between the simulated image 210 and the target image 200 may be excellent, within a pre-defined tolerance, at the simulation sites 201, 202, 203, 204, but may deviate significantly at non-simulation sites, as for example indicated by deviations 211 and 212. Even if addition fragmentations points, for example, i, j, and additional simulation sites, for example at 205 and 206, respectively, they may not correct the problem, as illustrated in FIG. 2B, where the additional simulation sites 205, 206 happen to be located where the agreement is good between the simulated image 210 and the target image 200, but the deviations at 211 and 212 are not significantly improved. On the other hand, placing finely spaced fragmentation points (indicated as circles or dots, such as a-h, but which, for clarity, are not all labeled), as illustrated in FIG. 2C, which have many corresponding simulation sites (indicated as lines vv intersecting the target image 200 between each fragmentation point), which may result in a simulation image 220 that is very close to the target image 200, but the large number of simulation sites results in impractical turnaround time.

In view of the above, there is a need in the semiconductor industry to provide a method of performing MBOPC, and in particular, for selecting fragmentation and simulation sites that provides improved image quality while minimizing runtimes.

SUMMARY OF THE INVENTION

It is an objective of the present invention to provide a method, system and computer program product capable of implementing the method for designing and modifying a mask layout that efficiently corrects for optical proximity effects.

According to a first aspect, this invention provides a method of designing a mask layout comprising: providing a layout of mask shapes; identifying a region of maximal influence on at least one of said mask shapes; determining an expected image within said region of maximal influence; determining the location of an extremum in said expected image; and defining a primary simulation site on an edge of said at least one of said mask shapes based upon a projection between said extremum and said edge.

According to a preferred embodiment of the invention, the mask shape includes a vertex, and the region of maximal influence comprises a search region around the vertex.

According to another aspect of the invention, edge fragmentation points are defined around the primary simulation site. Lithographic process simulation is performed that includes the primary simulation site. Other methodologies using simulation of the image, such as optical proximity correction or mask design verification, is performed wherein the simulation includes evaluating the image at the primary simulation site. By performing simulation at sites that are most likely influenced by adjacent features, a more accurate representation of optical proximity correction may be obtained than when the fragments are defined arbitrarily or merely geometrically.

The method of the invention may be implemented in a computer program product, for execution on a computer system. The method of the invention may be provided as a service for designing mask layouts, in particular to improve data prep operations.

Still other objects and advantages of the invention will in part be obvious and will in part be apparent from the specification.

DETAILED DESCRIPTION OF THE INVENTION

The present invention will now be described in greater detail by referring to the following discussion with reference to the drawings that accompany the present application. It is observed that the drawings of the present application are provided for illustrative purposes and thus they are not drawn to scale.

In accordance with the present invention, a method is provided for defining sites for simulation of images in model-based processes, such as MBOPC or mask verification, based on simulated images of selected portions of the layout, prior to defining the fragmentation of the shapes. More particularly, the portions of the layout selected for initial simulation are those that have maximal influence on the image of shapes.

The layout typically comprises shapes in the form of polygons having edges and vertices where the edges intersect. It is a known optical imaging property that the plane wavefront from an infinitely long edge of a shape is disturbed by the presence of a vertex of a shape (a vertex from the same shape or from a neighboring shape). An infinitely long edge without any vertex within the optical radius does not have to be fragmented. The optical radius around a point of a shape to be imaged is the radius within which the image of that point would be significantly influenced, within a pre-determined tolerance, by the presence or absence of another shape.

Figure 3:
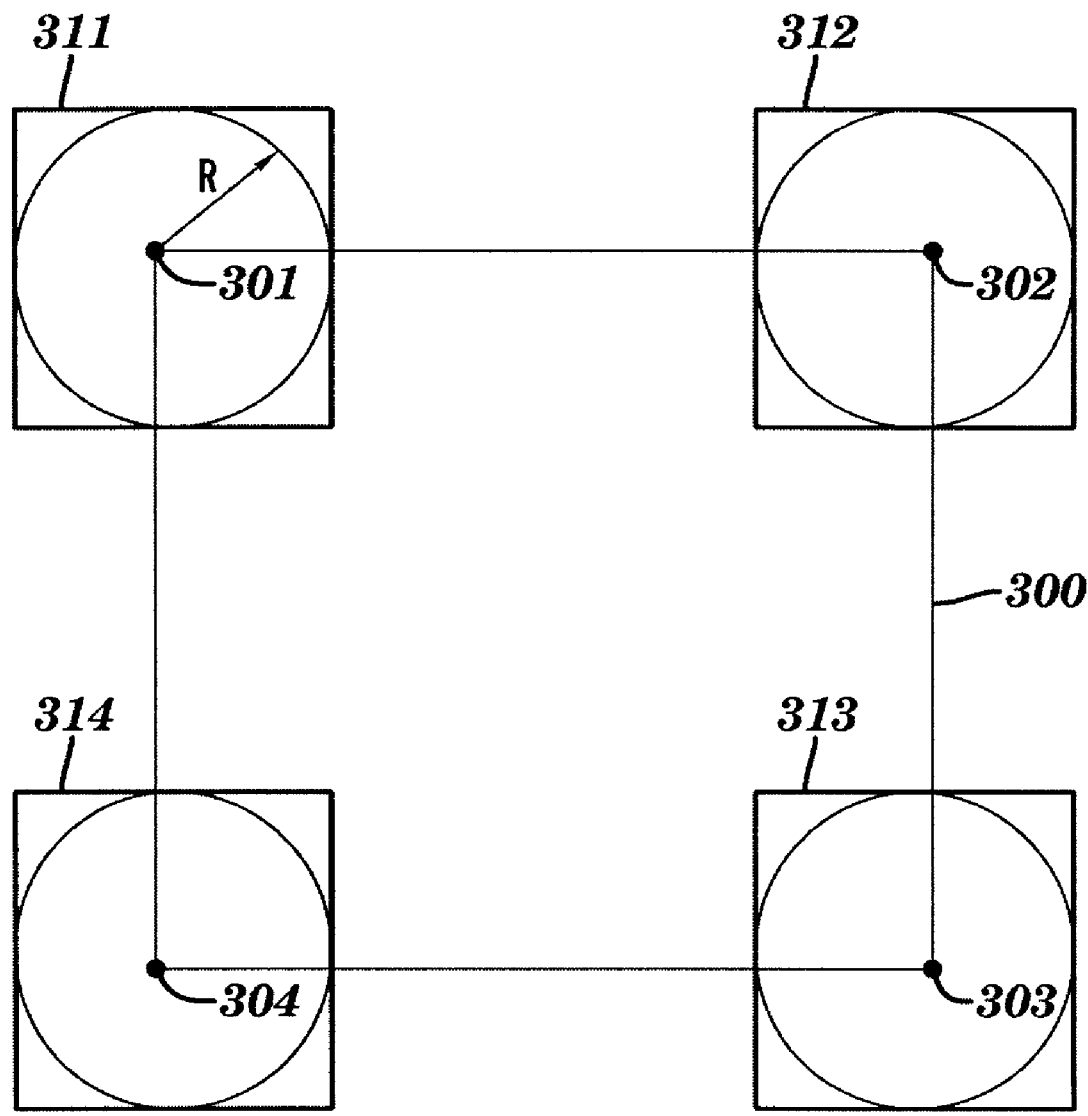
FIG. 3 illustrates a mask shape including vertices and search regions around the vertices, for initial simulation according to the invention.

According to the present invention, image evaluation sites (IES) are determined by reference to the expected image, for example, as determined by simulation. Only selected portions of the image are required to determine the IES. Preferably, simulation of the image is centered around the vertices of shapes, which may be identified by any method currently known or developed in the future, for example, by methods available in current OPC tools to identify tag vertices. In FIG. 3, a shape 300 is illustrated having vertices 301, 302, 303, 304. According to the invention, selected portions of the layout shapes are identified within which an initial simulation is performed to determine the expected image around the vertices. This region will be referred to as a search region, as discussed further below. A region of influence (ROI) is identified around each vertex, preferably enclosing at least the optical radius R. In this example, a square shaped ROI 311, 312, 313, 314 is chosen to enclose the circle centered on each respective vertex 301, 302, 303, 304, having a radius equal to the optical radius R. In this example, according to the invention, simulated images are determined within each ROI 311, 312, 313, 314.

Figure 4:
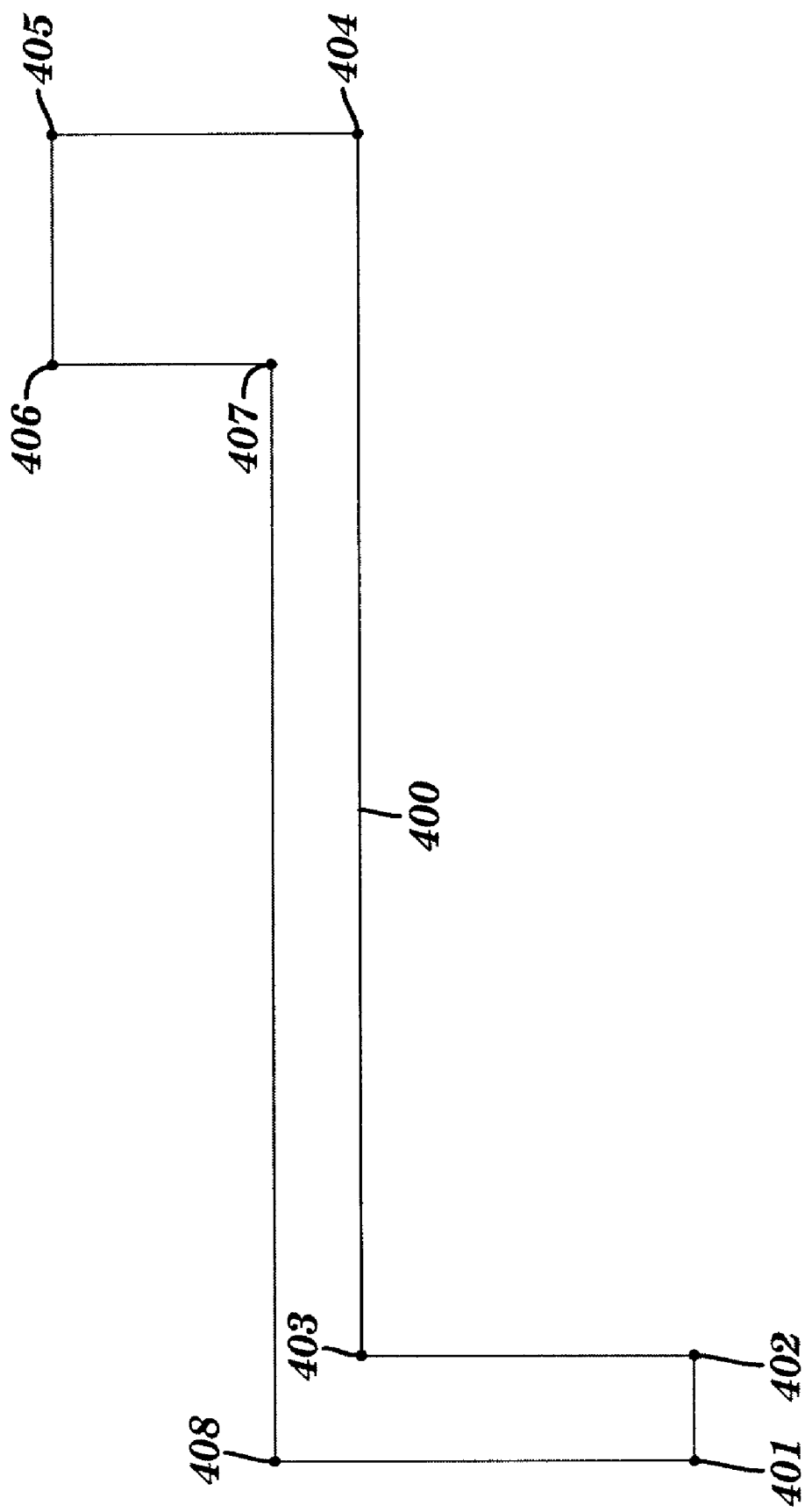
FIG. 4 illustrates a mask shape including vertices.
Figure 5:
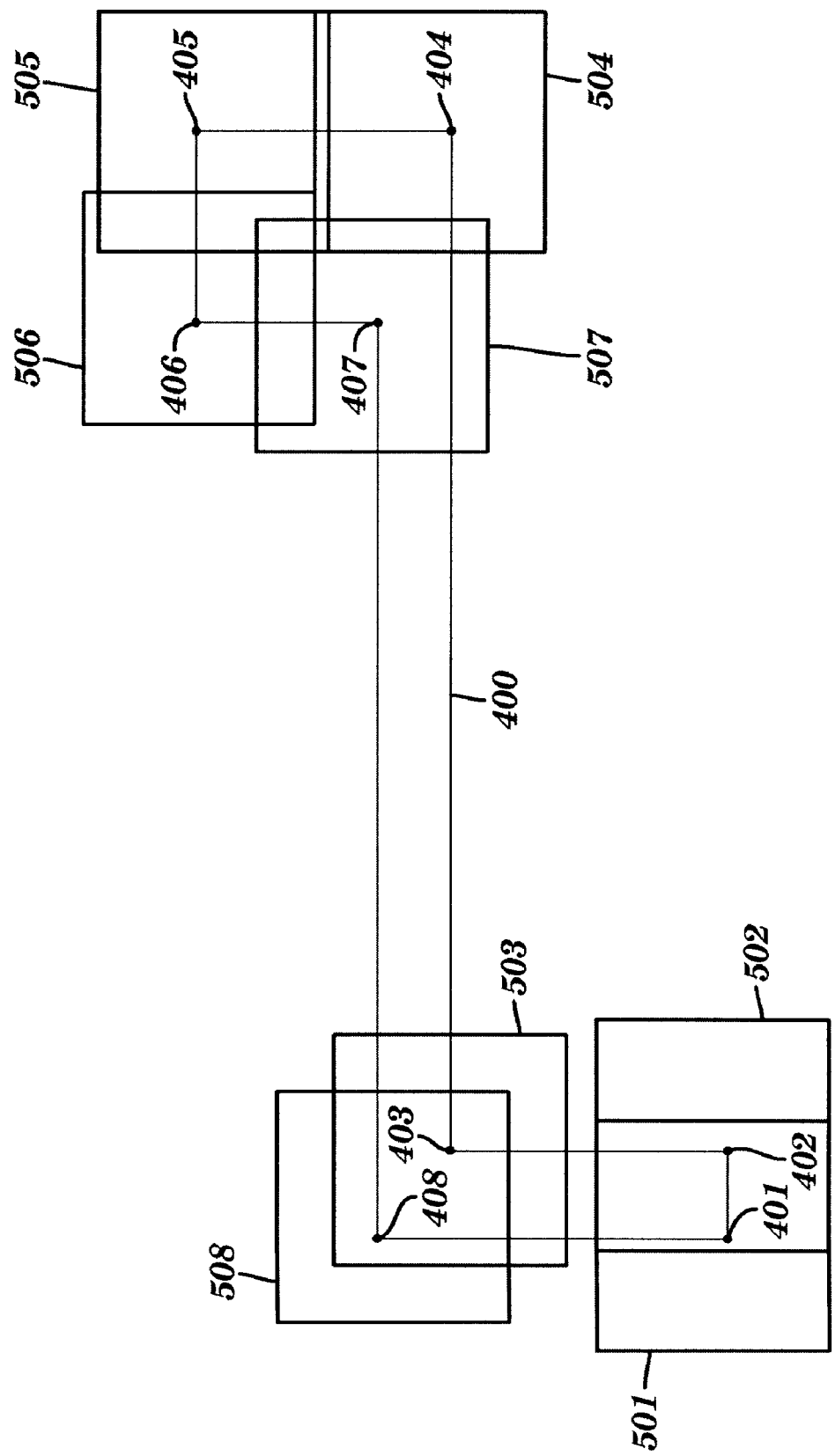
FIG. 5 illustrates the mask shape of FIG. 4, including search regions for initial simulation according to the invention.
Figure 6:
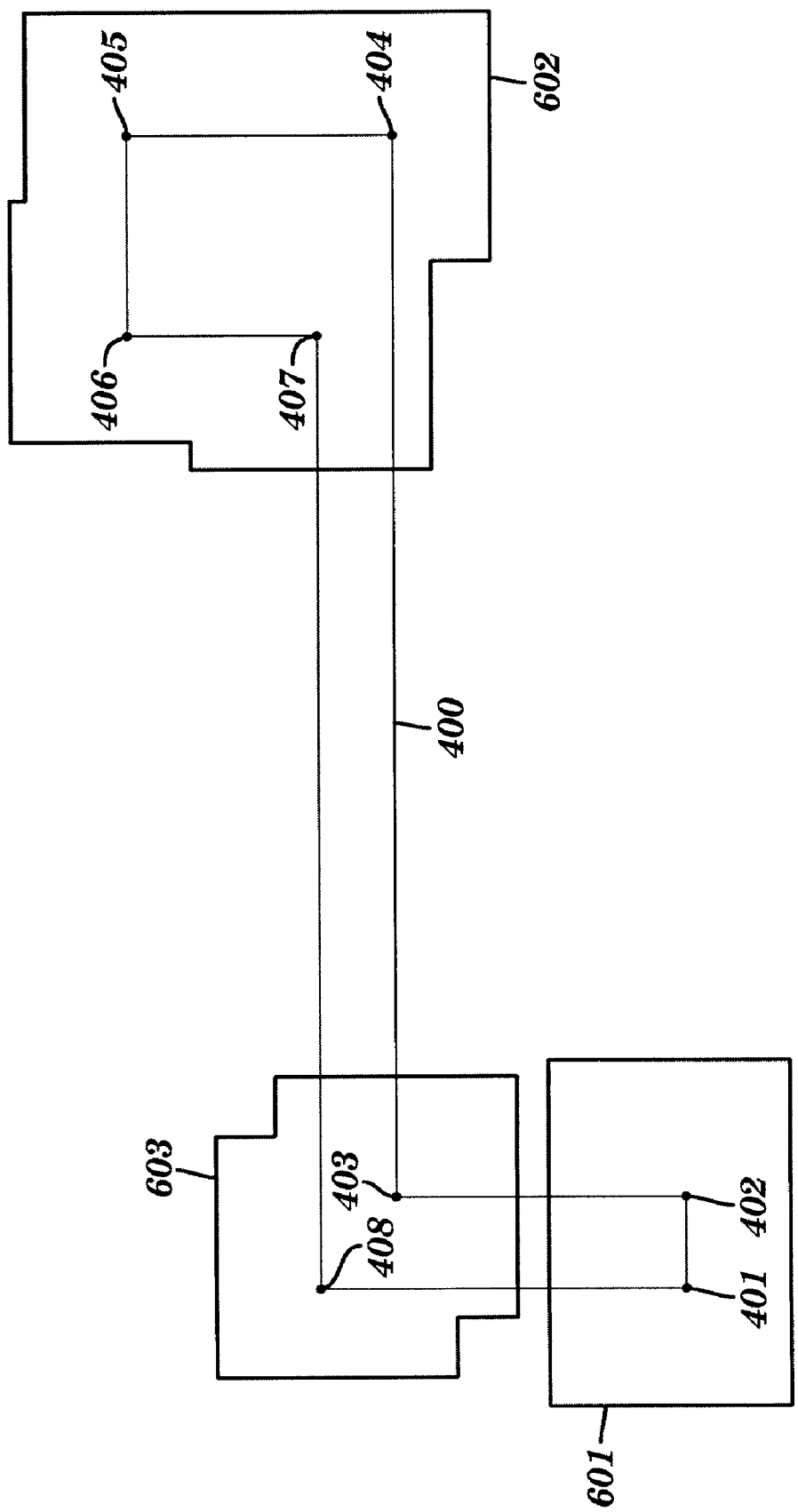
FIG. 6 illustrates the mask shape of FIG. 4, including merged search regions for initial simulation according to the invention.

For more complex shapes, if the ROI's around vertices may overlap, the ROIs are combined to form a more complex search region. For example, consider the shape 400 illustrated in FIG. 4. Shape 400 includes eight vertices 401-408. The ROIs around each vertex are determined, preferably each enclosing an area at least a large as the optical radius circle around a vertex, in this example, square areas 501, 502, 503, 504, 505, 506, 507 and 508 around vertices 401-408, respectively, as illustrated in FIG. 5. Where the ROIs overlap, the ROIs are merged to form a larger search region. For example, as illustrated in FIG. 6, the ROIs 501 and 502 around vertices 401, 402, respectively, are merged to form the search region 601. Similarly, ROIs 504, 505, 506, 507 are merged to form search region 602 and ROIs 503 and 508 are merged to form search region 603. If an ROI does not overlap with another ROI, then that ROI forms its own search region, for example, the search regions 311, 312, 313 and 314 in FIG. 3.

Once the search regions are selected, the search regions are discretized on a fine grid for simulation. The maximum spatial frequency $F_{Max}$ that passes through the optical system is given by:

$$F_{Max} = [(1+\sigma)NA]/\lambda,$$

where $\lambda$ is the wavelength of the illumination light, $\sigma$ is the partial coherence and NA is the numerical aperture. Preferably, the grid is chosen to be fine enough to ensure sufficient image accuracy, while minimizing run time. For example, a grid element size of about $0.25/F_{Max}$, or $0.25\lambda/[(1+\sigma)NA]$, should be sufficient. For the case of 193 nm illumination wavelength, a numerical aperture of 0.85 and a partial coherence of 0.85, a sufficient grid element size would then be about 30 nm should be sufficient to ensure sufficient image accuracy is achieved, while minimizing run time. Alternatively, any other methodology now known or developed in the future may used.

Figure 7:
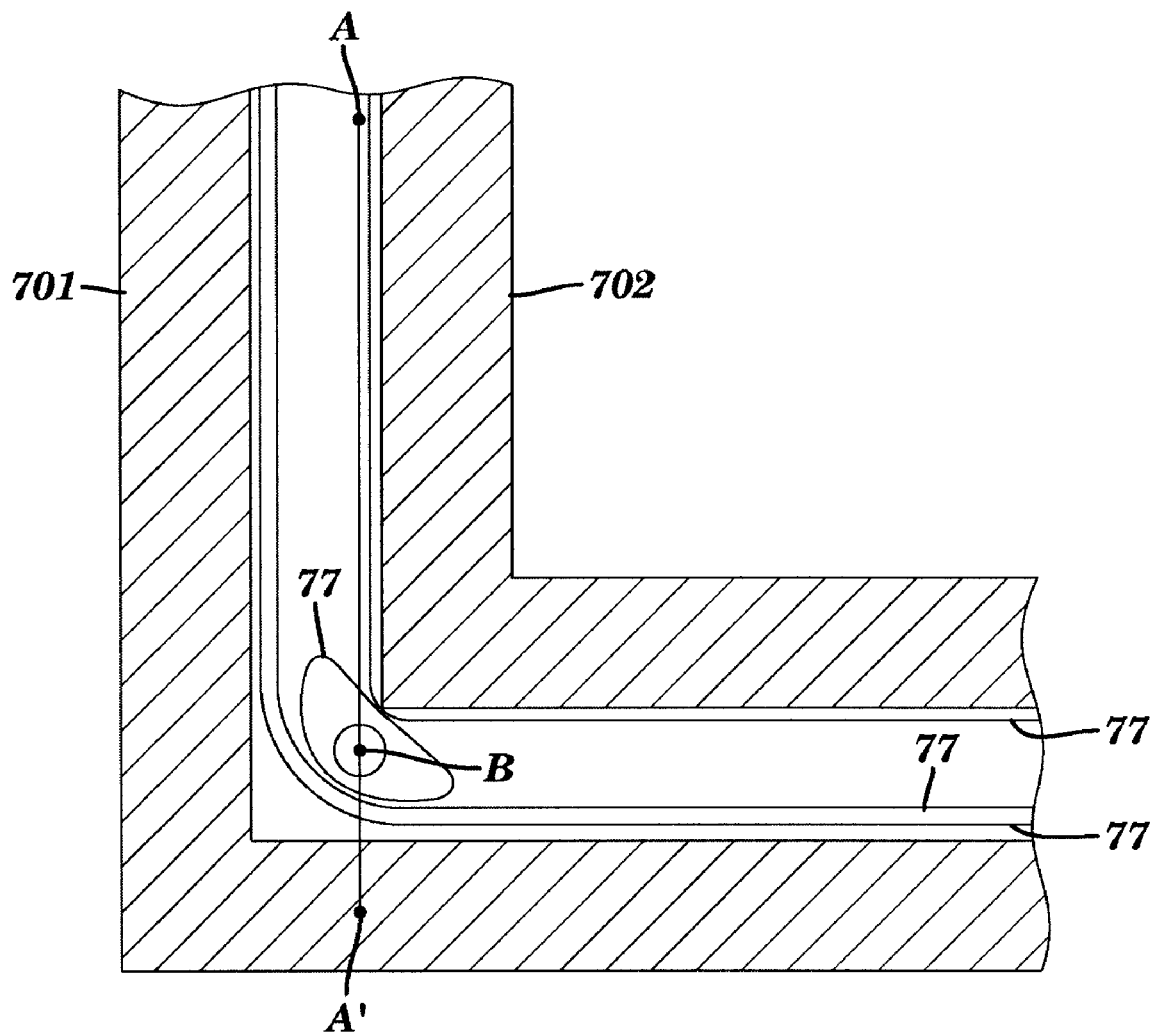
FIG. 7 illustrates two mask shapes having nested corner vertices, and corresponding selected simulation contours for those mask shapes.
Figure 8:
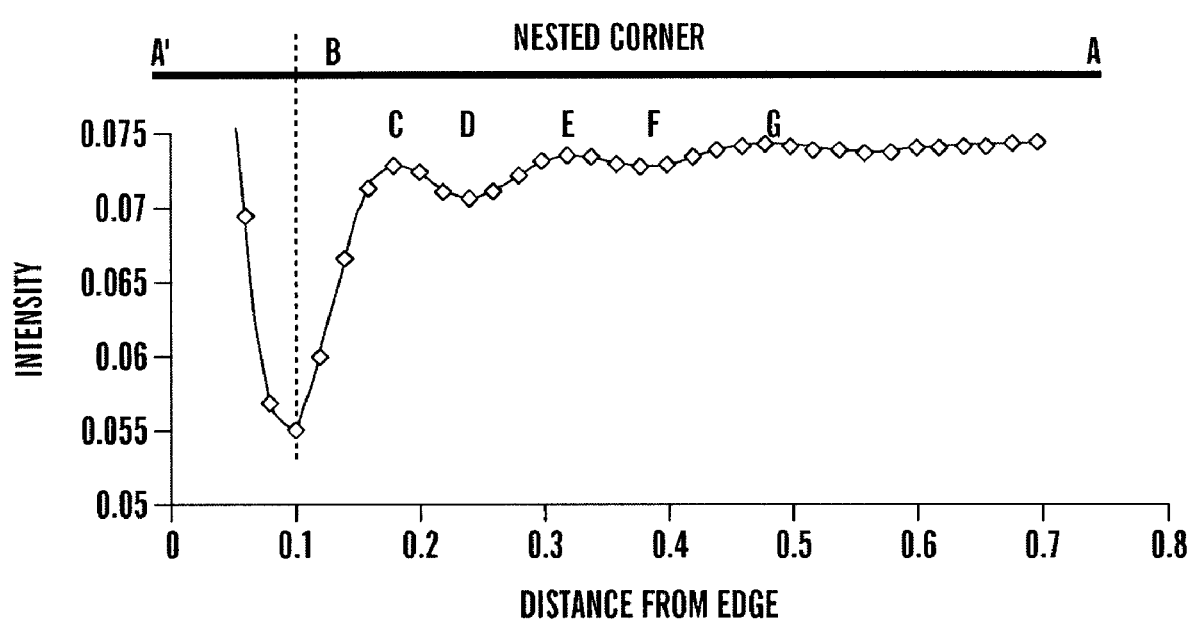
FIG. 8 is a plot of image intensity for the simulation of FIG. 7 along line A-A'.

An image is then simulated within each finely gridded search region. The maxima and minima, i.e., the extrema, of the resulting image intensity calculations are then identified within the search region, using any method now known or developed in the future. For example, referring to FIG. 7, two shapes 701 and 702 having nested corners are illustrated, with computed image contours 77 overlain (for clarity, not all of the computed contours are illustrated). As an example, referring to FIG. 8, the computed image intensities can be plotted, as for example, along the line A-A', and the extremum point B can be computed by interpolation of image intensities on the simulation grid.

Once the maxima and minima are identified, the influence of the maxima and minima are used to define the site simulation points or primary simulation sites (PSS) on the shape edges. For example, in FIG. 9, a shape 320 is illustrated having a vertices 321, 322 and an edge C. An extremum 901 of the simulated image in the search region has been identified in accordance with the present invention. Preferably, the primary simulation sites (PSSs) are defined by projecting a line perpendicular to the edges of shapes from each extrema point of the simulated image within the ROI of each extrema. The intersection of these perpendicular projections from extrema to shape edges are preferably used to define the simulation sites for MBOPC or mask verification. In this example, simulation site 910 is defined by projecting a line from extremum 901 on to the edge C. Note that the simulation sites may be selected based on other projections from the image extrema, for example, by projecting along the steepest image gradient. Any other projection from the image extremum may be used, and is contemplated by the invention.

Figure 9:
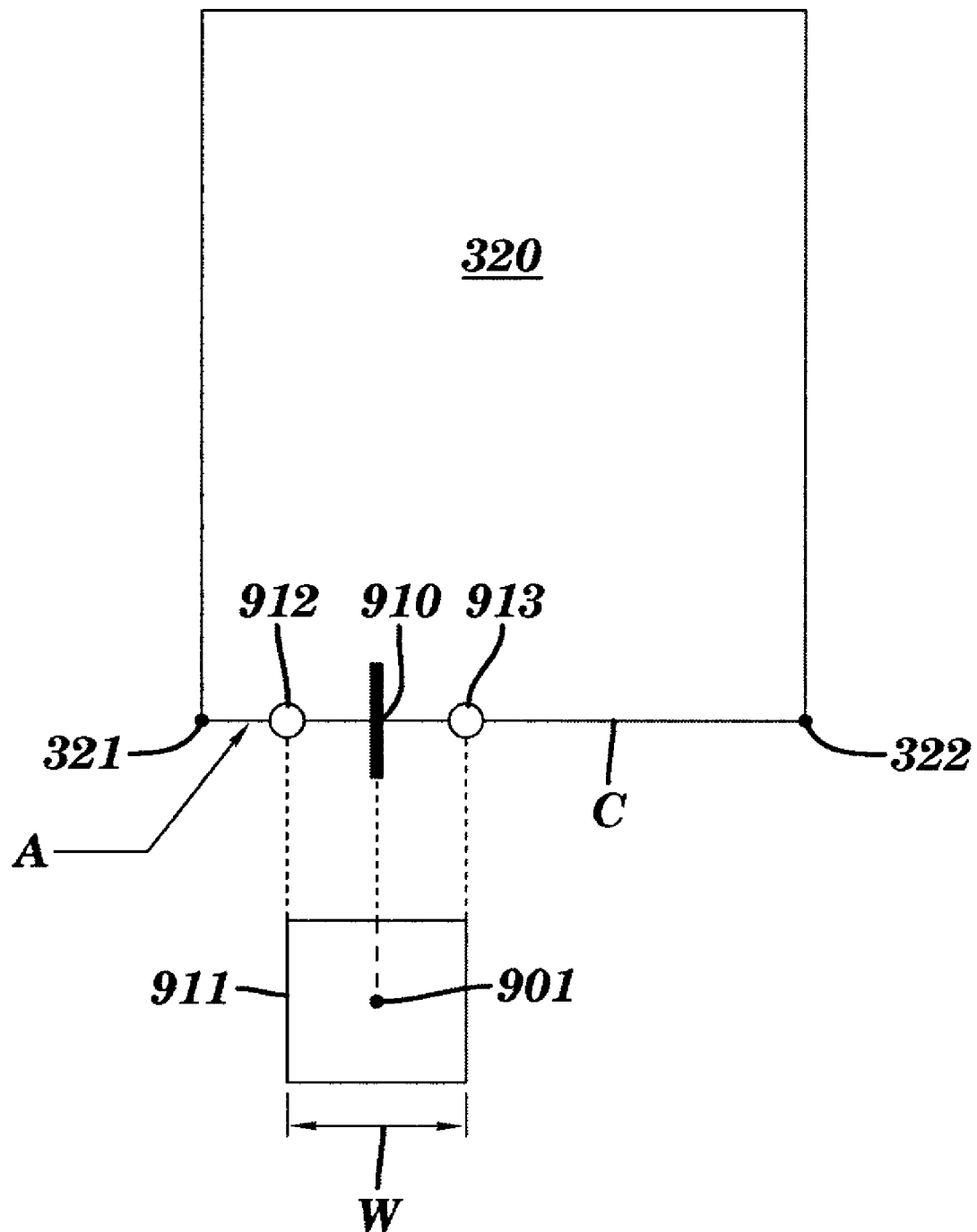
FIG. 9 illustrates an identified extremum and a projection between the extremum and an edge of a shape to define a simulation site in accordance with the present invention.

Next, in accordance with the present invention, the fragment locations are then determined around each simulation site that has been selected based on projection from the image extrema. Referring to FIG. 9, the extremum point 901 is determined, and the projection to the shape edge is made to define a primary simulation site 910. In accordance with the invention, the fragmentation points are next determined around the primary simulation site 910. According to one embodiment, a region of influence defined by boundary 911 around the extremum point 901 is determined by where the intensity profile from the extremum point 901 flattens, that is, where the first derivative of the image intensity is less than a predetermined value to define the boundary 911 of the region of influence. Then a projection of boundary 911 of the region of influence is projected to the edge of the shape 320 to define fragment points 912, 913. Alternatively, the boundary 911 of the region of influence may be defined where the second derivative of the image intensity is equal to zero. Note that FIG. 9 illustrates a single extremum 901, but within the initial, local simulation, there may be multiple extrema which would each define a primary simulation site. In the case of multiple extrema found within the initial simulation region, then, according to a preferred embodiment of the invention, the inflection point between the extrema, e.g. where the second derivative of the image intensity is zero, is projected to the shape edge to define a fragmentation point.

The PSS serve to determine "primary" fragments. It may be necessary to complement the PSS fragmentation by forming additional fragments and associated simulation sites by methods known in the art. However, in accordance with invention, the primary simulation sites (PSSs) are retained. Preferably, the primary fragmentations created based on projected region of influence around the extrema points are retained in the event of conflict between conventionally determined fragments.

In some cases, refragmentation may be required. For example, fragment A defined between the vertex 321 and fragmentation point 912 may be smaller than manufacturability rules allow. The fragment A may be re-fragmented, by any suitable method, for example by combining fragment A with the fragment defined by fragment points 912-913, to form a new fragment defined by the vertex 321 and fragment point 913. However, in accordance with the present invention, the PSS 910 is retained. Additional fragmentation points may be formed as needed, as long as the PSS sites, selected in accordance with the invention, are retained.

Figure 1:
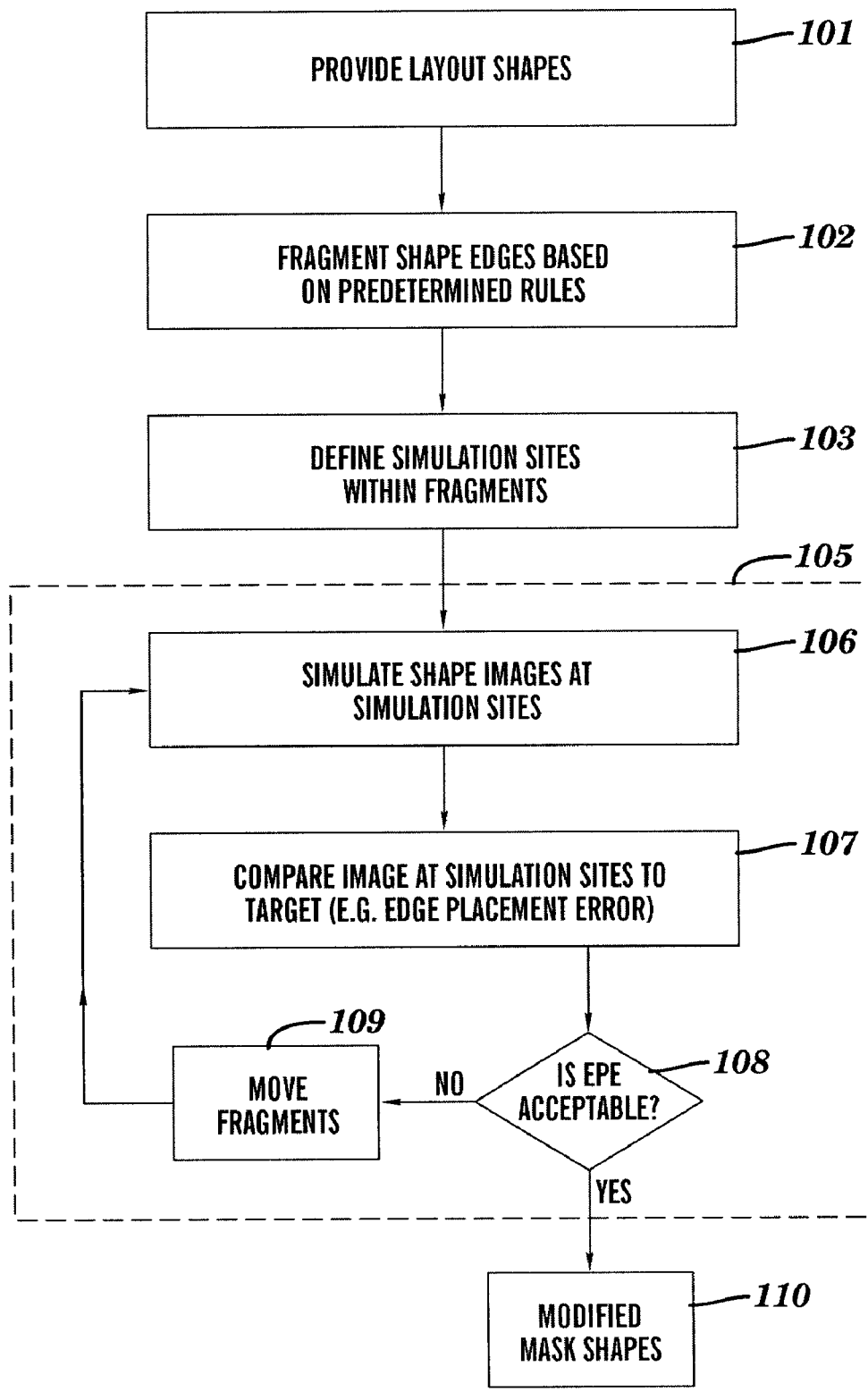
FIG. 1 is a flowchart illustrating a conventional method of fragmenting mask shapes and assigning simulation sites for optical proximity correction (OPC).
Figure 2A:
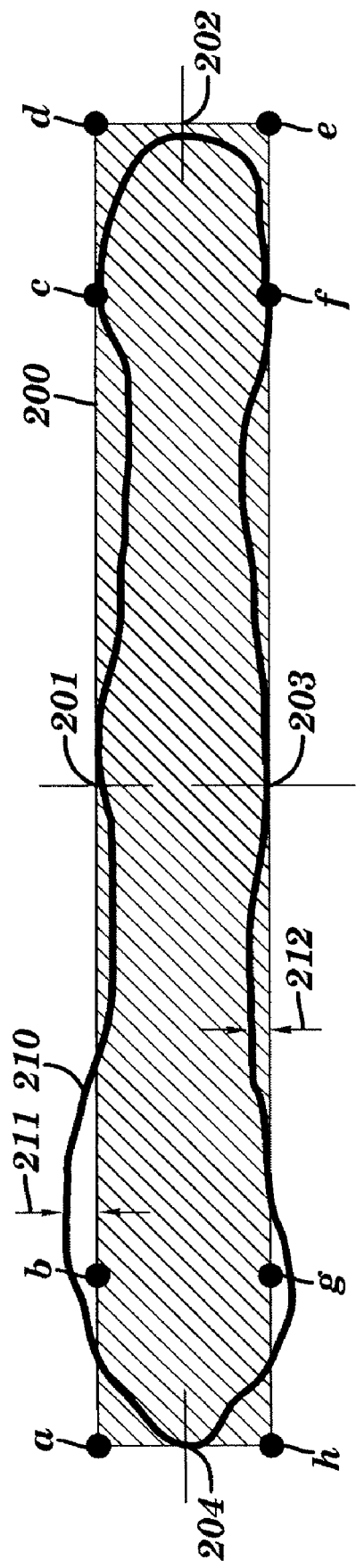
FIGS. 2A and 2B illustrate a convention method of fragmenting a mask shape and then assigning a simulation site for OPC.
Figure 2B:
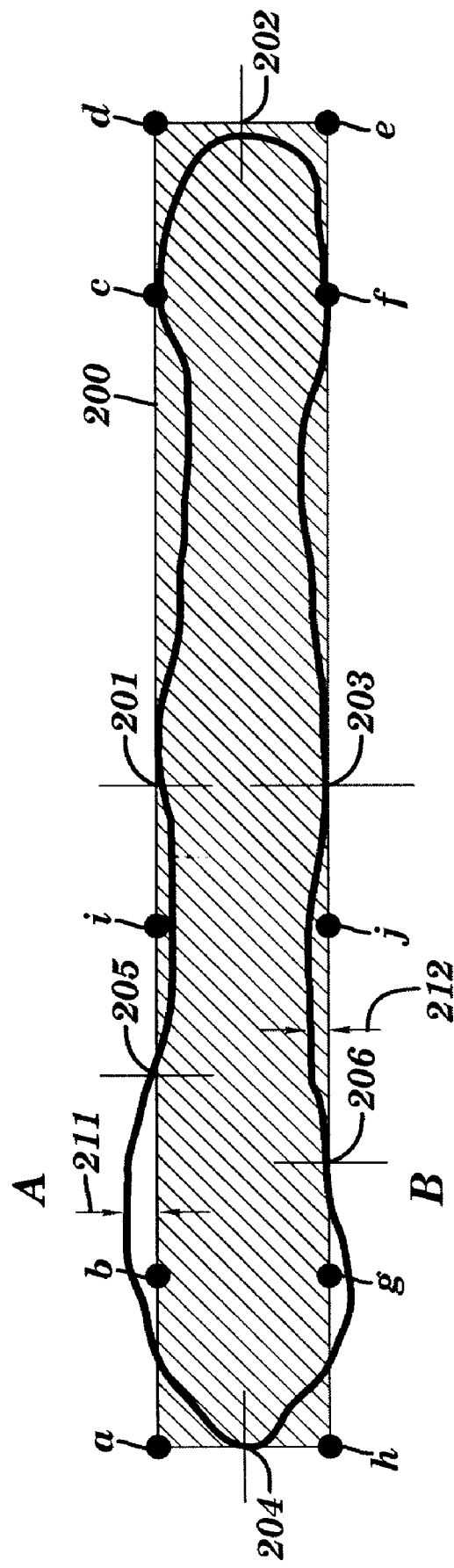
Figure 2C:
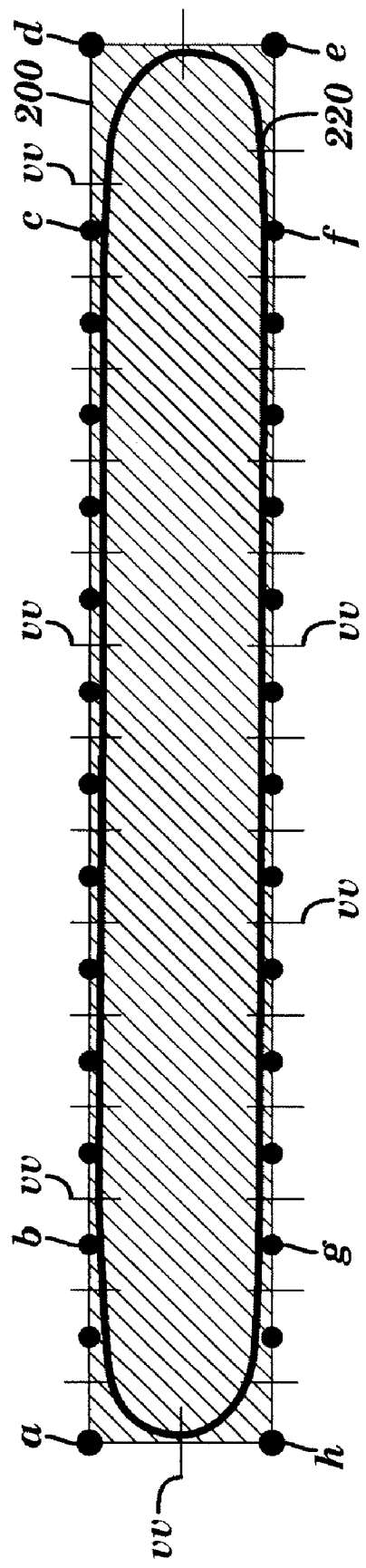
FIG. 2C illustrates a finely fragmented mask shape having many simulation sites.
Figure 10:
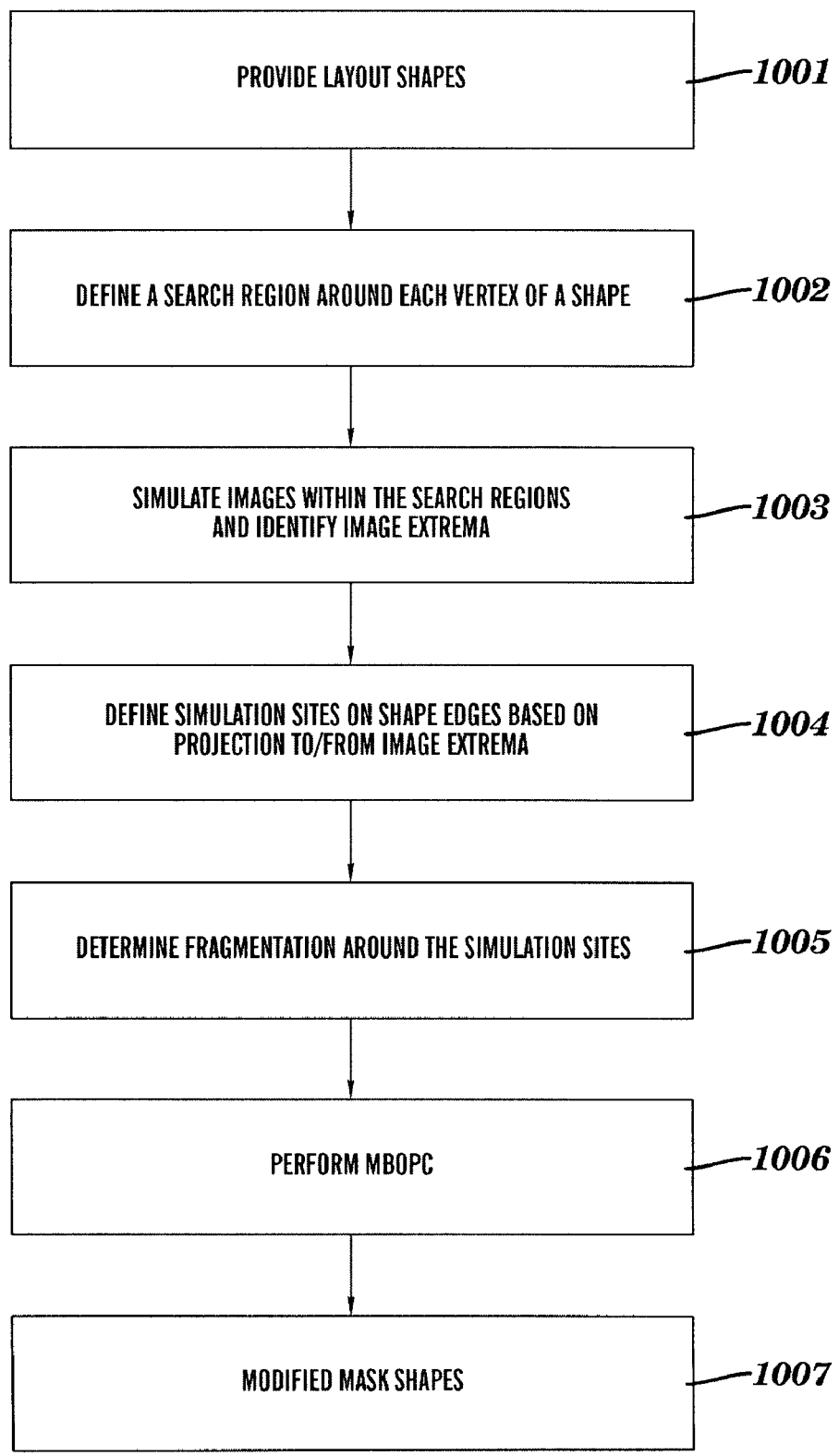
FIG. 10 is a flow chart of an embodiment of the method in accordance with the invention.

An embodiment of the method according to the present invention is illustrated in FIG. 10. The layout shapes representing the physical layout of a circuit design are provided (Block 1001). A search region is defined (Block 1002), preferably based on the ROI around each vertex that encloses the optical radius around the vertex, where overlapping ROIs are combined into a single search region. Images within the search regions are then simulated on a fine grid, and the image extrema are identified (Block 1003). Primary simulation sites (PSS) are then defined on the shape edges that are within the optical radius of the extrema, by a projection from the extrema onto the shape edge. After the PSS sites are selected, based on the projection of image extrema, then the fragmentation points are determined so that the selected PSS sites are within the fragments (Block 1005). Secondary or refragmentation may be performed, as long as the PSS sites selected based on the image extrema are retained. Then OPC or mask verification may be performed on the shapes (Block 1006), for example, using a method such as the one illustrated in FIG. 1. The resulting modified mask shapes are typically verified to ensure compliance with design and manufacturability rules, and then may be used to form a mask reticle (Block 1007).

Figure 11:
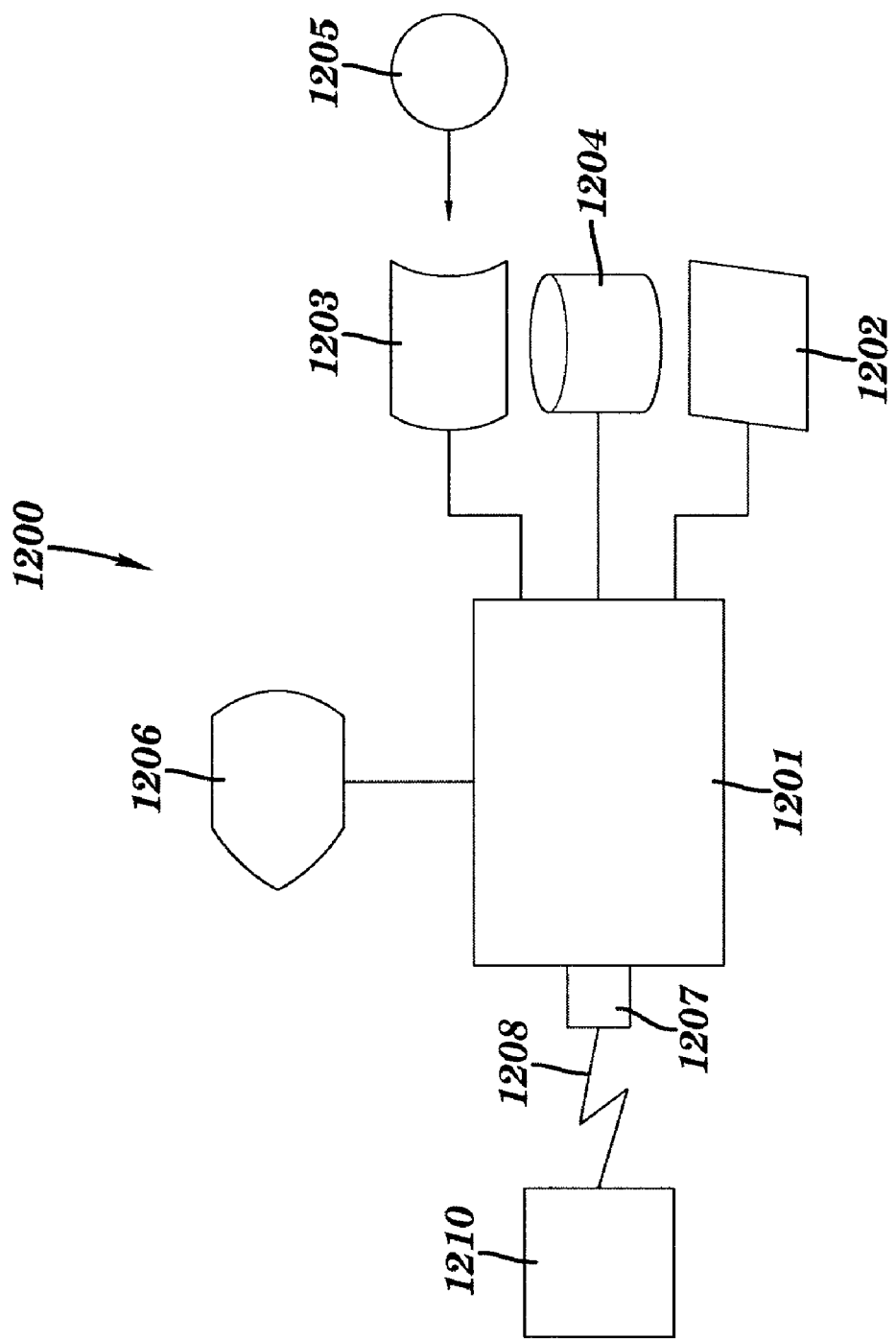
FIG. 11 is a computer system configured to perform the method steps of an embodiment in accordance with the invention.

The method of the present invention may be implemented as instructions in a computer program product or as part of a computer system. An example of a computer system 1200 configured to implement the method of the present invention is illustrated in FIG. 11, including a central processing unit (CPU) 1201 capable of executing the instructions, for example, as illustrated in FIG. 10. The CPU 1201 may be connected to an input/output device 1202, including but not limited to a keyboard, a mouse, or a reader, a display device 1206, such as a monitor, one or more storage devices 1204, 1203, which may include removable computer readable storage medium 1205 containing a computer program product comprising instructions for performing the inventive method. Alternatively, all or portions of the computer program product or the instructions may be provided to the CPU 1201 and/or stored on one or more of the storage devices 1203, 1204 by receiving instructions through a communications device 1207, including, but not limited to a wired device or a wireless device, which may send and receive information between the CPU 1201 or storage devices 1204, 1203 across a communications link 1208 to a remote device or system 1210. The remote device or system 1210 may, for example, be a tool for manufacturing lithographic masks, or may be located at a mask house where the mask design is to be manufactured, and the resulting mask shapes may be transmitted to the mask house.

In another embodiment of the present invention, the method according to the invention may be provided as a part of a service for designing a mask layout, wherein, simulation sites are defined based on simulated images around shape vertices, prior to fragmentation. Fragmentation is defined around the predefined simulation sites. More particularly, a service may be provided that includes, for a layout of shapes comprising a polygon including a vertex and an adjacent edge; defining a search region around said vertex; determining an expected image for the layout within said search region; determining the location of an extremum in said expected image within said search region; defining a primary simulation site on said adjacent edge based upon a projection between said extremum and said adjacent edge. The resulting layout and fragmentation shapes may be provided to the lithographic engineers for data preparation, such as OPC, which will result in improved mask shapes.

It is understood that the order of the above-described steps is only illustrative. To this extent, one or more steps can be performed in parallel, in a different order, at a remote time, etc. Further, one or more of the steps may not be performed in various embodiments of the invention.

It is understood that the present invention can be realized in hardware, software, a propagated signal, or any combination thereof, and may be compartmentalized other than as shown. Any kind of computer/server system(s)—or other apparatus adapted for carrying out the methods described herein—is suitable. A typical combination of hardware and software could be a general purpose computer system with a computer program that, when loaded and executed, carries out the respective methods described herein. Alternatively, a specific use computer, containing specialized hardware for carrying out one or more of the functional tasks of the invention could be utilized. The present invention also can be embedded in a computer program product or a propagated signal, which comprises all the respective features enabling the implementation of the methods described herein, and which—when loaded in a computer system—is able to carry out these methods. Computer program, propagated signal, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form. Furthermore, it should be appreciated that the teachings of the present invention could be offered as a business method on a subscription or fee basis. For example, the system and/or computer could be created, maintained, supported and/or deployed by a service provider that offers the functions described herein for customers. That is, a service provider could offer the functionality described above.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of designing a mask layout comprising:
   providing a layout of mask shapes;
   identifying a region of maximal influence on at least one of said mask shapes;
   determining an expected image within said region of maximal influence by simulating said expected image using a CAD tool configured to perform a model-based process;
   determining the location of an extremum in said expected image; and
   defining a primary simulation site on an edge of said at least one of said mask shapes based upon a projection between said extremum and said edge,
   wherein said at least one mask shape comprises a polygon including a vertex, and said region of maximal influence comprises a search region around said vertex, and
   wherein said polygon comprises a plurality of neighboring vertices, and wherein said search region is formed by determining for each of said plurality of neighboring vertices a neighboring vertex region of influence around each of said plurality of neighboring vertices, and combining said neighboring vertex regions of influence where said neighboring vertex regions of influence overlap to form said search region.

2. A computer program product comprising a computer usable medium having computer readable program embodied in said medium for designing an integrated circuit, wherein the computer readable program when executed on computer causes the computer to perform the method steps of:
   providing a layout of mask shapes;
   identifying a region of maximal influence on at least one of said mask shapes;
   determining an expected image within said region of maximal influence;
   determining the location of an extremum in said expected image; and
   defining a primary simulation site on an edge of said at least one of said mask shapes based upon a projection between said extremum and said edge,
   wherein said at least one mask shape comprises a polygon including vertex, and said region of maximal influence comprises a search region around said vertex, and
   wherein said polygon comprises a plurality of neighboring vertices, and wherein said search region is formed by determining for each of said plurality of neighboring vertices a neighboring vertex region of influence around each of said plurality of neighboring vertices, and combining said neighboring vertex regions of influence where said neighboring vertex regions of influence overlap to form said search region.

3. A method of providing a service for designing an integrated circuit, the service comprising:
   providing a layout of mask shapes;
   identifying a region of maximal influence on at least one of said mask shapes;
   determining an expected image within said region of maximal influence by simulating said expected image using a CAD tool configured to perform a model-based process;
   determining the location of an extremum in said expected image; and
   defining a primary simulation site on an edge of said at least one of said mask shapes based upon a projection between said extremum and said edge,
   wherein said at least one mask shape comprises a polygon including a vertex, and said region of maximal influence comprises a search region around said vertex, and
   wherein said polygon comprises a plurality of neighboring vertices, and wherein said search region is formed by determining for each of said plurality of neighboring vertices a neighboring vertex region of influence around each of said plurality of neighboring vertices, and combining said neighboring vertex regions of influence where said neighboring vertex regions of influence overlap to form said search region.

* * * * *